United States Patent
Sheng et al.

(10) Patent No.: US 12,205,734 B2
(45) Date of Patent: Jan. 21, 2025

(54) VARIABLE-STRUCTURE STACKED CABLE TOPOLOGY AND PACKAGING METHOD THEREFOR

(71) Applicant: SHANGHAI JIAO TONG UNIVERSITY, Shanghai (CN)

(72) Inventors: Jie Sheng, Shanghai (CN); Xueliang Wang, Shanghai (CN); Zhuyong Li, Shanghai (CN); Longbiao Wang, Shanghai (CN)

(73) Assignee: SHANGHAI JIAO TONG UNIVERSITY, Shanghai (CN)

( * ) Notice: Subject to any disclaimer, the term of this patent is extended or adjusted under 35 U.S.C. 154(b) by 0 days.

(21) Appl. No.: 18/032,806

(22) PCT Filed: Sep. 2, 2021

(86) PCT No.: PCT/CN2021/116079
§ 371 (c)(1),
(2) Date: Apr. 20, 2023

(87) PCT Pub. No.: WO2022/267224
PCT Pub. Date: Dec. 29, 2022

(65) Prior Publication Data
US 2023/0386704 A1    Nov. 30, 2023

(30) Foreign Application Priority Data

Jun. 24, 2021   (CN) .......................... 202110706940.2

(51) Int. Cl.
*H01B 12/10*   (2006.01)
*H10N 60/01*   (2023.01)

(52) U.S. Cl.
CPC ......... *H01B 12/10* (2013.01); *H10N 60/0801* (2023.02)

(58) Field of Classification Search
CPC ........................... H01B 12/10; H10N 60/0801
See application file for complete search history.

(56) References Cited

U.S. PATENT DOCUMENTS

2006/0073979 A1 *   4/2006   Thieme .............. H10N 60/0801
505/434

FOREIGN PATENT DOCUMENTS

| CN | 103210455 A | 7/2013 |
|----|-------------|--------|
| CN | 105632648 A | 6/2016 |

(Continued)

*Primary Examiner* — Paul A Wartalowicz
(74) *Attorney, Agent, or Firm* — Bayramoglu Law Offices LLC

(57) ABSTRACT

A variable-structure stacked cable topology includes: a plurality of sections of stacked cables. The plurality of sections of the stacked cables are connected sequentially. The sections of the stacked cables includes a plurality of base tapes at an equal quantity. The plurality of base tapes are connected mutually. At least one of the plurality of base tapes is a superconducting tape. A cable topological structure is formed by sequentially connecting a plurality of sections of stacked cables. Each of the sections of the stacked cables is provided with superconducting tapes or a combination of superconducting tapes and copper tapes to form a variable-structure cable topological structure. By packaging a different number of superconducting tapes in each area, this section of cable can be twisted into a coil in such a way that a critical current of the whole coil can be approximately uniform along a length direction of the cable.

3 Claims, 3 Drawing Sheets

(56) References Cited

FOREIGN PATENT DOCUMENTS

| | | | |
|---|---|---|---|
| CN | 106663503 | A | 5/2017 |
| CN | 110356242 | A | 10/2019 |
| CN | 112614623 | A | 4/2021 |
| EP | 2717341 | A2 | 4/2014 |
| WO | 2018236102 | A1 | 12/2018 |

\* cited by examiner

VARIABLE-STRUCTURE STACKED CABLE TOPOLOGY AND PACKAGING METHOD THEREFOR

CROSS REFERENCE TO THE RELATED APPLICATIONS

This application is the national phase entry of International Application No. PCT/CN2021/116079, filed on Sep. 2, 2021, which is based upon and claims priority to Chinese Patent Application No. 202110706940.2, filed on Jun. 24, 2021, the entire contents of which are incorporated herein by reference.

TECHNICAL FIELD

The present invention relates to the technical field of cables, and in particular to a variable-structure stacked cable topology and a packaging method therefor.

BACKGROUND

The second generation high-temperature superconducting material (REBCO coated conductor) has become a research hotspot in the field of power equipment due to the characteristics of no direct current resistance loss and high conduction current density, and its related applications such as superconducting cables, superconducting energy storage, superconducting transformers, superconducting current limiters and superconducting motors are rapidly developing. It has great advantages in the application of strong field magnets due to the higher upper critical magnetic field. However, due to a high width-to-thickness ratio, the second generation high-temperature superconducting tape has anisotropic characteristics. In order to obtain a higher engineering current density and weaken the anisotropy, researchers have proposed many different types of topological structures of high-temperature superconducting cables, including a transposition braided Roble cable, a twisted stacked tape cable (TSTC), a round copper core bundled cable (CORC), etc. These cables have their own advantages, but also have their own disadvantages. Among them, the stacked cables have great potential in the field of application of strong-field magnet due to the higher engineering current density. When the stacked cables are twisted into a coil, the coil acts as a partially uninsulated coil wound by a tape, and current may be randomly shared and shunted in the cable, so that the robustness of the magnet is improved. At present, the common preparation process for the stacked cable in the industry is to directly press and package a plurality of second generation high-temperature superconducting tapes by using soldering tin at 215° C., and the stacked cable is obtained after soldering tin is solidified, where the number of the superconducting tapes may be combined according to the thickness of the stacked cable and the thickness of the tape.

The critical current of the second generation high-temperature superconducting tape is greatly influenced by the magnetic field of a vertical tape. The stronger the magnetic field is, the lower the critical current is. Since the magnetic field in the strong-field magnet is often distributed unevenly throughout the space, the critical current of the superconducting material in the coil magnet is distributed unevenly. In this case, the actual running current mainly depends on a certain area with the lowest critical current in the whole magnet, that is, the so-called buckets effect. In order to overcome the buckets effect, it is necessary to further optimize the existing cable structure, so that the critical current of the coil formed by twisting the cable under the influence of different magnetic fields can reach a relatively uniform level.

SUMMARY

The present invention aims to solve one of the technical problems of low etching efficiency at least to a certain extent. Therefore, an objective of the present invention is to provide a variable-structure stacked cable topology and a packaging method therefor. To achieve the above objective, the present invention adopts the following technical solutions:

In view of this, provided is a variable-structure stacked cable topology according to an embodiment of the first aspect of the present invention, which includes: a plurality of sections of stacked cables, wherein the plurality of sections of the stacked cables are connected sequentially; the sections of the stacked cables each include a plurality of base tapes at an equal quantity; the plurality of base tapes are connected mutually; and at least one of the plurality of base tapes is a superconducting tape.

Further, at least one of the plurality of base tapes is a copper tape.

Further, if the base tapes on corresponding layers in adjacent sections of the stacked cables are both superconducting tapes or copper tapes, the base tapes in the adjacent sections are integrally formed; and if the base tapes on corresponding layers in adjacent sections of the stacked cables are a superconducting tape and a copper tape, respectively, the base tapes are connected by welding at the joint.

Further, the plurality of base tapes are combined through soldering tin.

Further, the plurality of base tapes are arranged to form a tiled structure.

Further, the variable-structure stacked cable topology further includes a packaging layer, wherein the packaging layer is arranged on an outer wall of the stacked cables.

According to the above technical solutions, compared with the prior art, the present invention provides a variable-structure stacked cable topology. A cable topological structure is formed by sequentially connecting a plurality of sections of stacked cables, wherein each of the sections of the stacked cables is only provided with superconducting tapes or a combination of superconducting tapes and copper tapes to form a variable-structure cable topological structure. By packaging a different number of superconducting tapes in each area, this section of cable can be twisted into a coil in such a way that a critical current of the whole coil can be approximately uniform along a length direction of the cable. This design of the variable-structure cable topology can not only increase magnetic field parameters of the coil, but also minimize the consumption of superconducting tape materials.

In view of this, provided is a packaging method for the variable-structure stacked cable topology according to an embodiment of the second aspect of the present invention, which specifically includes the following steps:

S10, calculating and analyzing a magnetic field distribution of a coil through finite element simulation;

S20, determining the number of sections of stacked cables according to the magnetic field distribution, and determining the number of layers of base tapes, the number of superconducting tapes and the number of copper tapes in each of the sections of the cables;

S30, forming an integrated structure by the base tapes on the same layer in each of the sections of the cables, wherein if the base tapes on corresponding layers in adjacent sections of the stacked cables are both superconducting tapes or copper tapes, the base tapes in the adjacent sections are arranged to form an integrally formed structure; and if the base tapes on corresponding layers in adjacent sections of the stacked cables are a superconducting tape and a copper tape, respectively, the superconducting tape and the copper tape in the adjacent sections are connected by spot welding; and S40, packaging a plurality of layers of the base tapes formed in the S30 by using a soldering tin furnace, specifically, pressing the plurality of layers of the base tapes together through the cooperation of a pay-off reel and a guide wheel, penetrating the plurality of layers of the base tapes through a soldering tin pool to pass through a soldering tin liquid melted at an ambient temperature of 150-200° C., and solidifying soldering tin carried on the base tapes in the air to enable the base tapes to form a complete cable after pulling out the base tapes from a soldering tin pool.

Further, the packaging method for the variable-structure stacked cable topology further includes external packaging, specifically, packaging the outside of the cable formed by packaging of the soldering tin furnace by using copper or aluminum to form a packaging layer.

The packaging method for the variable-structure stacked cable topology uses one of the above variable-structure stacked cable topologies. The connection relation and the position relation between components of the variable-structure stacked cable topology have been described above, and the technical effect achieved by the packaging method for the variable-structure stacked cable topology has been described above in the above variable-structure stacked cable topologies, which will not be described herein again.

BRIEF DESCRIPTION OF THE DRAWINGS

In order to more clearly illustrate the technical solutions in the examples of the present invention or in the prior art, the drawings required to be used in the description of the examples or the prior art are briefly introduced below. It is obvious that the drawings in the description below are merely examples of the present invention, and those of ordinary skilled in the art can obtain other drawings according to the drawings provided without creative efforts.

Figure 1:
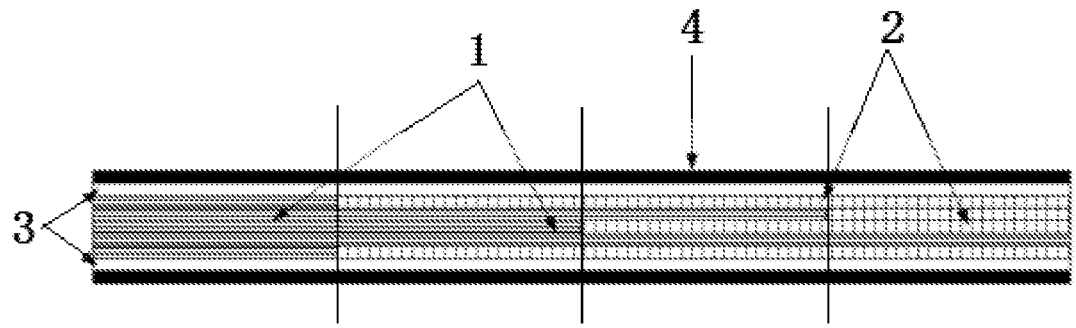
FIG. 1 is a schematic structural diagram of a variable-structure stacked cable topology according to the present invention.

In the drawings: 1 represents a superconducting tape; 2 represents a copper tape; 3 represents soldering tin; and 4 represents a packaging layer.

DETAILED DESCRIPTION OF THE EMBODIMENTS

The technical schemes in the embodiments of the present invention will be clearly and completely described below with reference to the drawings in the embodiments of the present invention, and it is obvious that the described embodiments are only a part of the embodiments of the present invention but not all of them. Based on the embodiments of the present invention, all other embodiments obtained by those of ordinary skilled in the art without creative efforts fall within the protection scope of the present invention.

Figure 2:
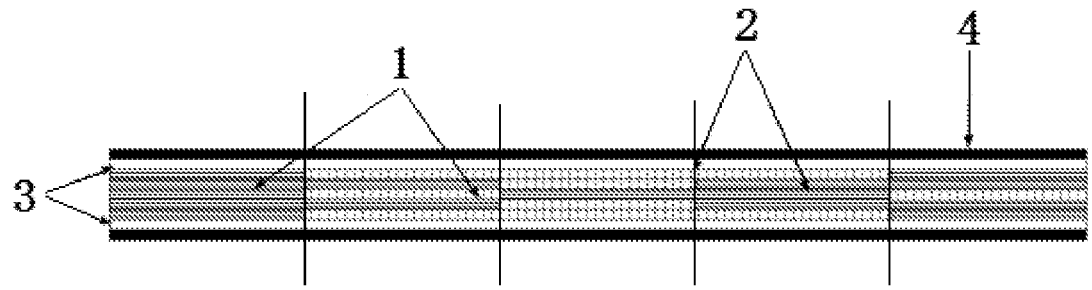
FIG. 2 is another schematic structural diagram of a variable-structure stacked cable topology according to the present invention.

Referring to FIG. 1 and FIG. 2, in one aspect, an embodiment of the present invention discloses a variable-structure stacked cable topology, which includes: a plurality of sections of stacked cables, wherein the plurality of sections of the stacked cables are connected sequentially to form a complete cable; the sections of the stacked cables each include a plurality of base tapes at an equal quantity; the plurality of base tapes are connected mutually; at least one of the plurality of base tapes is a superconducting tape 1; the superconducting tape 1 is a second generation high-temperature superconducting material, REBCO coated conductor, which has higher engineering current density and is a conductor mainly for transmitting current; and each of the sections of the base tapes specifically includes two modes: 1: the base tapes in an area of a certain section of cable are all superconducting tapes 1, and 2: this area of the section of cable includes two materials, including superconducting tape 1 and a copper tape 2, and is formed by a combination of the superconducting tape 1 and the copper tape 2.

According to an embodiment of the present invention, if the base tapes on corresponding layers in adjacent sections of the stacked cables are both superconducting tapes 1 or copper tapes 2, the base tapes in the adjacent sections are integrally formed; and if the base tapes on corresponding layers in adjacent sections of the stacked cables are a superconducting tape 1 and a copper tape 2, respectively, the base tapes are connected by spot welding at the joint, the plurality of base tapes are combined through soldering tin 3, and the plurality of base tapes are arranged to form a tiled structure.

According to an embodiment of the present invention, the variable-structure stacked cable topology further includes a packaging layer 4, wherein the packaging layer 4 is arranged on an outer wall of the stacked cables, and the packaging layer 4 is a copper layer, an aluminum layer or other layers, preferably, a copper layer.

In another aspect, the present invention further discloses a packaging method for the variable-structure stacked cable topology, which specifically includes the following steps:

S10, calculating and analyzing a magnetic field distribution of a coil through finite element simulation;

S20, determining the number of sections of stacked cables according to the magnetic field distribution, and determining the number of layers of base tapes, the number of superconducting tapes 1 and the number of copper tapes 2 in each of the sections of the cables;

S30, forming an integrated structure by the base tapes on the same layer in each of the sections of cables, wherein if the base tapes on corresponding layers in adjacent sections of the stacked cables are both superconducting tapes 1 or copper tapes 2, the base tapes in the adjacent sections are arranged to form an integrally formed structure; and if the base tapes on corresponding layers in adjacent sections of the stacked cables are a superconducting tape 1 and a copper tape 2, respectively, the superconducting tape 1 and the copper tape 2 in the adjacent sections are connected by spot welding; and S40, packaging a plurality of layers of the base tapes formed in the S30 by using a soldering tin furnace, specifically, pressing the plurality of layers of the base tapes together through the cooperation of a pay-off reel and a guide wheel, penetrating the plurality of layers of the base tapes through a soldering tin pool to pass through a soldering tin liquid melted at an ambient temperature of 150-200° C., preferably, at an ambient temperature of 200° C., and solidifying soldering tin 3 carried on the base tapes in the air to enable the base tapes to form a complete cable after pulling out the base tapes from a soldering tin pool.

In some other embodiments, the packaging method for the variable-structure stacked cable topology further includes external packaging, specifically, packaging the outside of the cable formed by packaging of the soldering tin 3 furnace by using copper or aluminum to form a packaging layer 4.

Embodiment 1

Figure 3:
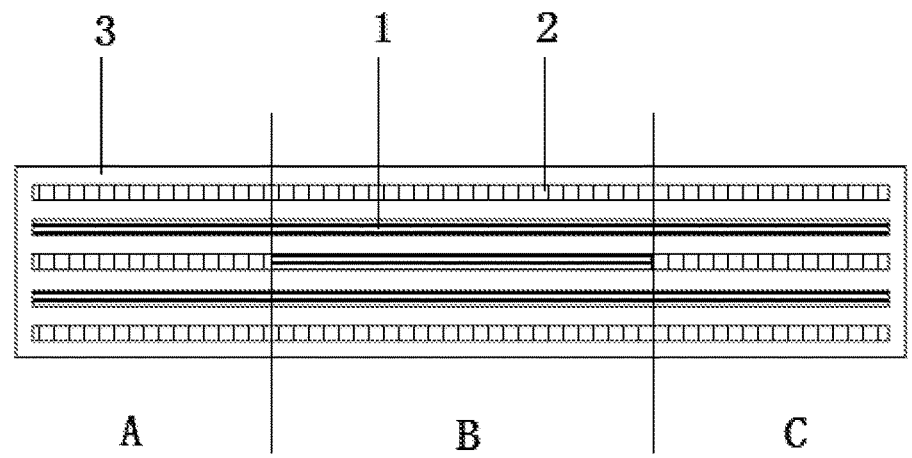
FIG. 3 is a schematic structural diagram of Embodiment 1 according to the present invention.

Referring to FIG. 3, this embodiment further explains a variable-structure stacked cable topology by using three-section five-layer stacked cables, specifically, three sections are an area A, an area B and an area C. In some other embodiments, the number of sections of the stacked cables and the number of base tapes are specifically set according to actual requirements, which are not listed here.

Provided is a variable-structure stacked cable topology, which includes: three sections of stacked cables, wherein the three sections of the stacked cables are connected sequentially to form a complete cable; and the sections of the stacked cables each include five base tapes, wherein the area A includes two superconducting tapes 1 and three copper tapes 2; the area B includes three superconducting tapes 1 and two copper tapes 2; and the area C includes two superconducting tapes 1 and three copper tapes 2. In this embodiment, in the three sections, the base tapes on the first layer and the fifth layer are all integrally formed superconducting tapes 1; the base tapes on the second layer and the fourth layer are all integrally formed copper tapes 2; the base tapes in the area A, the area B and the area C on the third layer are a copper tape 2, a superconducting tape 1 and a copper tape 2, respectively, and the superconducting tape 1 and the copper tape 2 are connected by spot welding; the five layers of base tapes are arranged to form a tiled structure, and the base tapes between the layers are fixedly combined through soldering tin 3.

Figure 4:
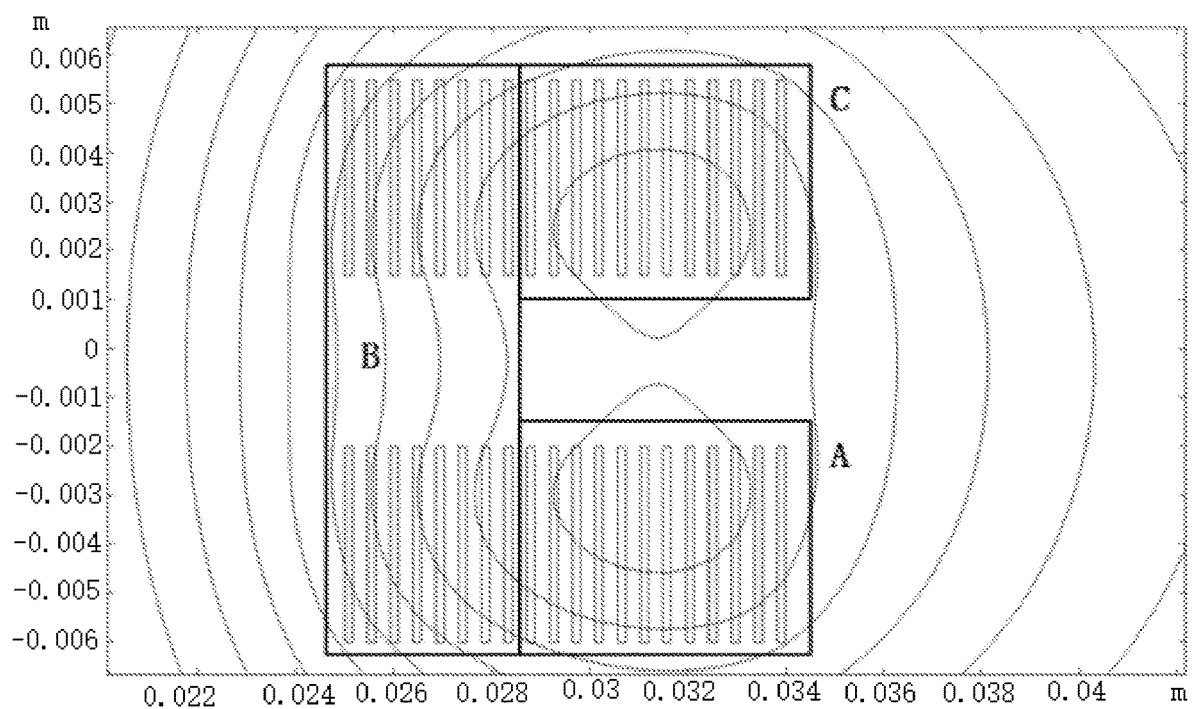
FIG. 4 is a schematic structural diagram of equipotential lines of magnetic force lines on a pancake coil at the running current of 135 A according to the present invention.
Figure 5:
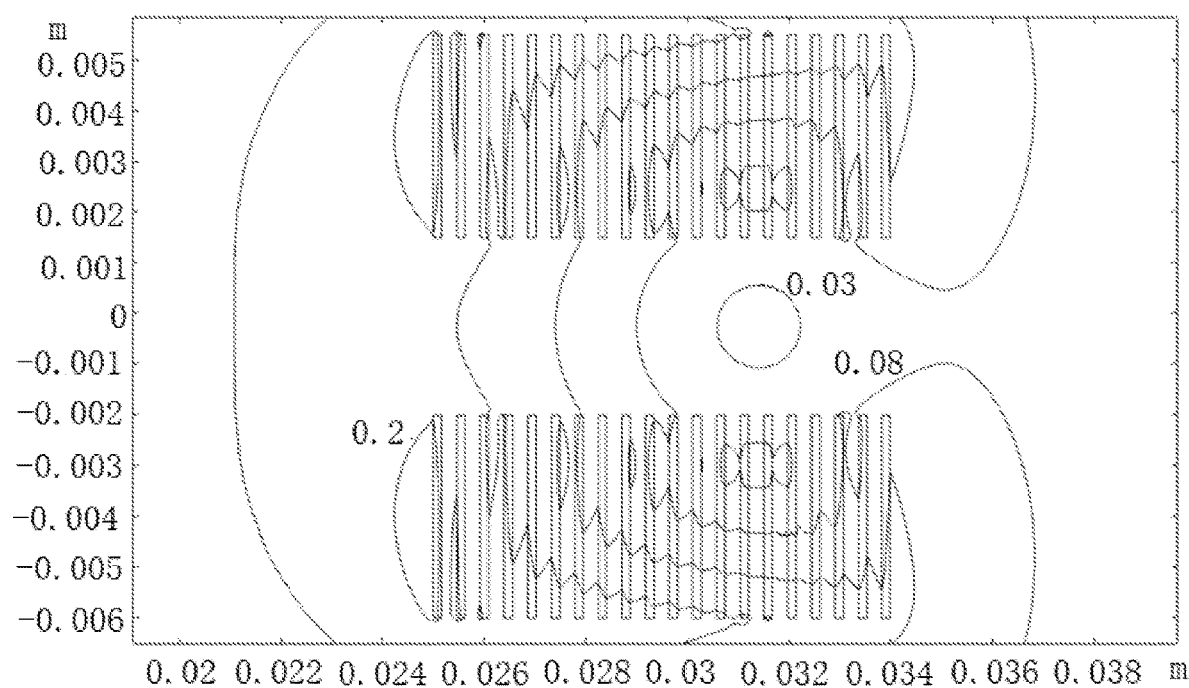
FIG. 5 is a schematic structural diagram of equipotential lines of magnetic field strength on a pancake coil at the running current of 135 A according to the present invention.

Specifically, the cable is twisted into a pancake coil, the magnetic field intensity range of the area A is 0.000274-0.2058T, the magnetic field intensity range of the area B is 0.0846-0.2511T, and the magnetic field intensity in the region C is 0.0002575-0.2059T; and magnetic lines and magnetic field intensity equipotential lines on the pancake coil at the running current of 135 A are specifically shown in FIG. 4 and FIG. 5.

The embodiments in the specification are all described in a progressive manner, and each embodiment focuses on differences from other embodiments, and portions that are the same and similar between the embodiments may be referred to each other. Since the device disclosed in the embodiment corresponds to the method disclosed in the embodiment, the description is relatively simple, and reference may be made to the partial description of the method.

The above description of the disclosed embodiments enables those skilled in the art to implement or use the present invention. Various modifications to these embodiments will be readily apparent to those skilled in the art, and the generic principles defined herein may be applied to other embodiments without departing from the spirit or scope of the present invention. Thus, the present invention is not intended to be limited to these embodiments shown herein but is to accord with the broadest scope consistent with the principles and novel features disclosed herein.

What is claimed is:

1. A structure of a variable-structure stacked cable topology, comprising:
 a plurality of sections of stacked cables, wherein
 the plurality of sections of the stacked cables are connected sequentially;
 the plurality of sections of the stacked cables comprise a plurality of base tapes at an equal quantity;
 the plurality of base tapes are connected mutually;
 at least one of the plurality of base tapes is a superconducting tape;
 at least one of the plurality of base tapes is a copper tape; and
 the plurality of base tapes are combined through soldering tin; and wherein the base tapes in the adjacent sections are integrally formed on corresponding layers in adjacent sections of the stacked cables that are both superconducting tapes or copper tapes; and
 the base tapes are connected by welding at a joint on the corresponding layers in the adjacent sections of the stacked cables that are the superconducting tape and the copper tape, respectively.

2. The structure of the variable-structure stacked cable topology according to claim 1, wherein the plurality of base tapes are arranged to form a tiled structure.

3. The structure of the variable-structure stacked cable topology according to claim 1, further comprising a packaging layer, wherein the packaging layer is arranged on an outer wall of the stacked cables.

* * * * *